United States Patent [19]
Park et al.

[11] Patent Number: 5,768,188
[45] Date of Patent: Jun. 16, 1998

[54] MULTI-STATE NON-VOLATILE SEMICONDUCTOR MEMORY AND METHOD FOR DRIVING THE SAME

[75] Inventors: Jong-Wook Park, Seoul; Kang-Deog Suh, Kyungki-do, both of Rep. of Korea

[73] Assignee: Samsung Electronics Co., Ltd., Suwon, Rep. of Korea

[21] Appl. No.: 763,612

[22] Filed: Dec. 11, 1996

[30] Foreign Application Priority Data

Dec. 11, 1995 [KR] Rep. of Korea .............. 95-48348

[51] Int. Cl.$^6$ ................................. G11C 11/34
[52] U.S. Cl. ................... 365/185.03; 365/185.17; 365/189.05
[58] Field of Search .............. 365/185.03, 185.17, 365/189.05

[56] References Cited

U.S. PATENT DOCUMENTS 5,596,526  1/1997  Assar et al. .................. 365/185.03

OTHER PUBLICATIONS

M. Bauer et al., A Multilevel–Cell 32Mb Flash Memory, IEEE International Solid–State Circuits Conference, Session 7, Flash Memory, Paper TA 7.7, Feb. 16, 1995 pp. 132–133.

Primary Examiner—A. Zarabian
Attorney, Agent, or Firm—Myers Bigel Sibley & Sajovec

[57] ABSTRACT

A non-volatile integrated circuit memory device includes an array of memory cells. Each of a plurality of word lines corresponds to a respective row of memory cells, and each of a plurality of bit lines corresponds to a respective column of the memory cells. A current supplying transistor includes a source coupled to a supply voltage source, a gate coupled to a static voltage source, and a drain coupled to the bit lines. The current supplying transistor provides a static current to the bit lines during data read operations. A storage unit has a pair of latches coupled to respective input/output lines to perform a data exchange. The latches are further coupled to respective bit lines to perform a sense operation during the data read operation. Each of a pair of storage control transistors is associated with a respective one of the latches, and each of the storage control transistors inverts and maintains a state of data latched in the storage unit in accordance with levels of the bit lines and in response to enable signals applied thereto during a reading operation. An initialization transistor is connected to each of the bit lines, and the initialization transistor initializes the storage unit in response to a control signal applied thereto before execution of the reading operation while maintaining the bit lines at a respective predetermined voltage levels. A pair of program data transmission transistors are each arranged between a respective one of the latches of the storage unit and a respective bit line associated with the respective latch. Each of the programmed data transmission transistors transmits data latched in the respective latch to the associated bit lines during a programming operation.

20 Claims, 14 Drawing Sheets

MULTI-STATE NON-VOLATILE SEMICONDUCTOR MEMORY AND METHOD FOR DRIVING THE SAME

FIELD OF THE INVENTION

The present invention relates to the field of integrated circuit memory devices and more particularly to non-volatile integrated circuit memory devices.

BACKGROUND OF THE INVENTION

Non-volatile integrated circuit memory devices can be classified into the following categories: mask ROMs; EPROMs; EEPROMs; and flash-EEPROMs. Among these memory devices, flash-EEPROMs have recently been discussed as permanent memories for personal computers in that they can achieve an electrical conversion of information while erasing stored data in a flash.

In conventional non-volatile memory devices, memory cells can take one of two information storing states, namely, the "ON" state and "OFF" state. One bit of information is defined by the ON or OFF state of a respective memory cell. In order to store data of N bits (N: a natural number of 2 or greater) in the conventional memory devices mentioned above, N independent memory cells are necessary. When it is required to increase the number of bits of data to be stored in a memory device having one-bit memory cells, the number of such memory cells should increase correspondingly.

Information stored in a conventional one-bit memory cell is determined by the programmed status of the memory cell where programming is used to store the desired information in the memory cell. The information storing state of the memory cell is determined by the threshold voltage which is a minimum voltage to be applied between the gate and source terminals of the transistor included in the memory cell in order to switch the cell transistor to its ON state. In other words, memory cells have different information storing states in accordance with different threshold voltages thereof. In the case of a mask ROM, a difference in the threshold voltage for a cell transistor is obtained by programming it using ion implantation. In the case of EPROMs, EEPROMs, and flash-EEPROMs, a difference in the threshold voltage for cell transistors is obtained by storing different amounts of charge in the floating gates of the memory cells.

In particular, each memory cell transistor has two gates including upper and lower layers laminated on a channel region between source and drain regions. The upper gate is called a control gate. A charge storage portion is surrounded by an insulating material between the control gate and the channel region. This charge storage portion is called a floating gate. Accordingly, the state of information stored in each memory cell can be distinguished by the threshold voltage of that memory cell.

In order to read information stored in the memory cells of a memory device, it is necessary to check the information storing state of the programmed memory cells. To this end, signals required to read state information from a selected memory cell are applied to circuits associated with the selected memory cell by use of a decoder circuit. As a result, a current or voltage signal indicative of the stored information of the memory cell can be obtained on a bit line. In this way, the programmed information of a memory cell can be found by measuring the obtained current or voltage signal.

These memory devices can have a NOR-type or a NAND-type memory cell array structure depending on the connection of the memory cells to respective bit lines. In a NOR-type memory cell array, each memory cell is connected between a bit line and a ground line. In a NAND-type memory cell array, a plurality of memory cells are connected in series between a bit line and a ground line. A group of memory cells connected in series to one bit line along with selection transistors used to select those memory cells is called a string. The selection transistors may include a first transistor arranged between the series-connected memory cells and the associated bit line, and a second transistor arranged between the series-connected memory cells and a ground line.

When reading information stored in a NAND-type memory device, a selected transistor in a selected string is switched to the ON state. In addition, a voltage higher than that applied to the control gate of the selected memory cell is applied to the control gates of unselected memory cells. As a result, the unselected memory cells have a low equivalent resistance as compared to the selected memory cell. The magnitude of the current flowing through the string from the associated bit line thus depends on the information stored in the selected memory cell of the string. The voltage or current corresponding to the information stored in each selected memory cell is sensed by a sensing circuit which is generally known as a sense amplifier.

Many schemes have been proposed to increase the information storage capacity of memory devices without involving an increase in chip size. For example, information of at least two bits can be stored in each memory cell. Conventionally, a memory cell stores only one bit of information therein. However, when 2 bits of information are stored in one memory cell, this memory cell is programmed with either "00", "01", "10" or "11". Accordingly, a memory device can store twice the information with the same number of memory cells as compared to a memory device wherein only one bit is stored in a memory cell. When storing 2 bits per memory cell, a multi-state memory device is provided wherein the threshold voltage of each memory cell can be programmed to have one of four different values. Because the memory capacity per memory cell is doubled, the chip size can be reduced while providing the same memory capacity. As the number of bits stored per memory cell increases, the data storage capacity of the multi-state memory device increases.

A multi-state memory device can be advantageously realized using the above-mentioned NOR-type memory configuration. In particular, the amount of current flowing through a selected memory cell during a read operation in a memory device having a NOR-type configuration is determined by the state of the memory cell. The word line connected to a selected memory cell is switched to its ON state when information stored in the selected memory cell is to be read. The bit line to which the selected memory cell is connected is also selected so that current flowing through the bit line or voltage induced on the bit line can be processed using one or more sensing circuits. Accordingly, a NOR-type memory device is advantageous in that it can be easily applied to multi-state memories. A NOR-type memory device also has the advantage that a relatively high operation speed can be achieved.

Referring to FIG. 12, a circuit diagram of a current sense amplifier applied to a conventional NOR-type multi-state memory and an associated timing diagram are shown. FIG. 12 illustrates an example of a current sensing scheme adapted to sense the magnitude of current induced in accordance with the threshold voltage of a memory cell. The memory is a flash memory manufactured by Intel Inc. and disclosed in the reference "A Multi Level Cell 32 Mb Flash Memory", IEEE International Solid-State Circuits Conference, 1995. In the sensing amplifier of FIG. 12, one sense amplifier is provided per bit line. For this reason, this sensing amplifier is usually applied only to NOR-type memory devices. In other words, it may be difficult to apply this sensing amplifier to NAND-type memory devices. Where this sensing amplifier is applied to a NAND-type memory device, a problem may occur in that the layout of the chip may become difficult due to the complex configuration of the NAND-type memory device. In such a NAND-type memory device, each memory cell should be connected between a bit line and a ground line, thus causing the memory cell array to be bulky relative to NAND-type memory devices.

In addition, a multi-state memory may be more difficult to realize in a NAND-type memory device than in a NOR-type memory device. This difficulty may result because the amount of current flowing through a selected string is influenced not only by information stored in a selected memory cell, but also by states of unselected memory cells in the selected string due to the series connection of those memory cells between the bit line and ground line. For such NAND-type memory devices, it may thus be difficult to utilize the current sensing techniques proposed for the conventional NOR-type memory devices.

As apparent from the above discussion, the use of NAND-type memory devices may involve various difficulties even though NAND-type memory devices may provide a higher degree of integration when compared with NOR-type memory devices. For this reason, the application of NAND-type memory devices to multi-state memory techniques have not been realized. It is believed, however, that if NAND-type memory devices can be combined with the multi-state memory techniques proposed for NOR-type memory devices, then very desirable effects can be obtained. In particular, very compact memory chips may be obtained by virtue of a reduced number of memory cells and an improved degree of integration of memory cells.

An example of a conventional voltage sensing technique proposed for NAND-type memory device is illustrated in FIG. 13. According to this technique, a selected word line signal level is applied to the gate of a selected memory cell, and the different bit line signal levels induced due to different threshold voltages of cells are sensed. The connection relationship between memory cells of a NAND type multi-state memory device and a sense amplifier applied to the NAND type multi-state memory device is shown in FIG. 13. Memory cells 3A to 7A and 3B to 7B are each adapted to store 2 bits of information per cell in the respective floating gates, and the plurality of memory cells are arranged in a NAND-type array.

In order to form a cell string of a NAND-type multi-state memory device, the memory cells 3A to 7A or 3B to 7B are connected in series between a first selection transistor 2A or 2B and a second selection transistor 8A or 8B respectively coupled to a string selection line SSL and a ground selection line GSL. In the illustrated example, two cell strings are formed. Bit lines BL1 and BL2 are respectively coupled to the memory cells of the strings via the selection transistors 2A and 2B. Although FIG. 13 illustrates two cell strings and circuits associated therewith, the memory device has a configuration in which larger numbers of strings can be coupled to respective bit lines, to obtain an increased storage capacity.

In one chip, the memory cell transistors of each string make up a memory cell array. In this memory cell array, the cell transistors are arranged in a matrix having a plurality of columns and rows. In each operation mode, strings and at least one word line belonging to the same group are selected. In order to commonly apply a voltage corresponding to the operation mode to the control gates of memory cells coupled to the selected word line, a row decoder and program controller 1 is coupled to the gates of the first and second selection transistors and all word lines. The row decoder and program controller 1 applies a signal for driving the selected transistors, the controller 1 also applies a column decoding signal, for selecting desired columns, to the string selection line SSL, the ground selection line GSL, and word lines WL1 to WL16. These signals are voltage signals.

The transistors 2A to 8A and 2B to 8B of the strings are controlled in response to the signals applied to their gate terminals and control gate terminals so that they are maintained in an ON state or an OFF state. The selection of a particular memory cell is thus achieved by activating the word line to which the selected memory cell is connected, activating the string selection transistors associated with the selected memory cell, and activating the bit line selection transistors for the bit line to which the string associated with the selected memory cell is connected. As shown in FIG. 10, the conventional integrated circuit memory device has a configuration for programming data into the multi-state memory cell array wherein a plurality of strings are coupled to the row decoder and program controller 1. This memory device can also be configured for reading the programmed data, erasing the programmed data for a desired purpose, and conducting a verification for each operation of the device.

In particular, the semiconductor memory device of FIG. 13 includes a bit line selection and charge unit 100 connected to both bit lines BL1 and BL2, a bit line level control unit 200 coupled to the bit line selection and charge unit 100, a multi-state reference voltage generating unit 350, and a page buffer 300 coupled to both the bit line level control unit 200 and multi-state reference voltage generating unit 350. The page buffer 300 serves to temporarily store data so that the data can be written at one time to memory cells via bit lines associated with the memory cells during the programming operation. The page buffer 300 also determines whether or not the program has been executed, in the program verification operation. During the write operation, the page buffer 300 senses and amplifies data on the bit lines read from the memory cells.

As shown in FIG. 13, the page buffer 300 includes a sensing circuit 14 as a sense amplifier, a pair of data storing latches each including a pair of cross-connected inverters 17 and 18 (or 21 and 22), and a plurality of associated transistors N8, N9, N10, N11, N12, N13, N14, N15, N16, and P11. The bit line selection and charge unit 100 includes charging PMOS transistors P1 and P2 which receive a supply voltage at source terminals thereof, and PMOS and NMOS transistors P3, N3, N4 and P4 which select one of the two bit lines BL1 and BL2. The PMOS transistors P1 and P2 include drain terminals respectively coupled to the source terminals of transistors N1 and N2 to inhibit an application of high voltage. The transistors N1 and N2 include source-drain channels respectively connected to the bit lines BL1 and BL2 which are also labelled with the reference numerals 9 and 10.

A control signal BLSHF is applied to the gate terminals of the transistors N1 and N2. The bit line level control unit 200 includes a current source 23 coupled between the ground and a node 11 to which the source terminal of the selection transistor N3 is connected. The bit line level control unit 200 also includes PMOS transistors P5, P6 and P7 with respective source-drain channels connected between the node 11 and the supply voltage source, and a reset NMOS transistor N5 with a source-drain channel coupled between the node 11 and the ground.

The multi-state reference voltage generating unit 350 includes NMOS and PMOS transistors N6, N7, P8, P9 and P10 which supply three different reference voltages Vref1, Vref2 and Vref3 to a node 12 to which the second input stage (−) of the sensing circuit 14 is connected. In the circuit of FIG. 13 having the above-mentioned configuration, one page buffer 300 exists per two bit lines. The selection of one of these two bit lines is achieved by the selection transistors P3, N3, N4 and P4 which respond to bit line selection signals BSO and bar-capped BSO which are selectively applied to their gate terminals.

The source level of memory cells in the memory device of FIG. 13, however varies in accordance with the position of a selected cell because the memory device has a NAND type configuration in which the memory cells are connected together in series. Basically, this variation occurs because the sum of turn-on resistance values of unselected memory cells varies in accordance with the position of the selected cell. For this reason, a variation in Vsb occurs in accordance with the position of the selected memory cell. Here, "Vsb" is the potential difference between the source level and the substrate bias level. The selected memory cell exhibits a threshold voltage which increases as Vsb increases toward a higher positive (+) value. Accordingly, a problem may result in that at the same selection word line level, different bit line levels may be exhibited even for the memory cells erased at the same threshold voltage level in accordance with the positions of those memory cells.

When an increase in bit line level occurs in accordance with the selection of a certain memory cell, the source level of the selected memory cell increases. As a result, a decrease in Vgs occurs. Here, "Vgs" is the voltage difference between the gate voltage and the source voltage. Because of this decrease in Vgs, the current flowing through the selected memory cell is gradually reduced with the lapse of time. When Vgs decreases below the threshold voltage of the selected memory cell, only a very small amount of sub threshold current is allowed to flow through the memory cell. Accordingly, the bit line level increases slowly with the lapse of time. This increasing bit line level may result in a difficulty in achieving a stable sensing operation. Although the load current source 23, which serves to compensate for the sub threshold current in association with each bit line, is provided in order to reduce this problem, it is difficult to practically provide a static current source corresponding to the sub threshold current of each memory cell.

The number of nominal memory cells in a multi-state memory device corresponds to the number of physical memory cells times the number of bits of data per cell. For example, when storing 2 bits of data per cell in 64M memory cells, the number of nominal memory cells is 128M. In this example, two page buffers (namely, two data latches) for every bit line may be needed to sense the two bits of data read from each cell. Each page buffer has a logic level distribution corresponding to the threshold voltage distribution of the memory cells. When storing 2 bits of data per cell, each page thus has four logic levels "11", "10", "01" and "00". For this reason, an appropriate column selecting circuit is also needed.

However, known column selecting circuits may be unsuitable for the above-mentioned application. FIG. 14 illustrates an example of a conventional column selecting circuit used for one-bit per cell memory devices. As shown, the column selecting circuit has a configuration including 8 separate I/O blocks 111 to carry out a wide column selecting operation by bytes. Data lines are connected to the corresponding I/O blocks 111 in accordance with a column decoding operation. When one row is selected by a column address, in this I/O-divided configuration, 8 bits of data are simultaneously read by the same addresses of the 8 I/O blocks.

With the multi-state NAND-type memory discussed above, two page buffers connected to the same bit line should be coupled to different I/O lines. For example, the first page buffer is connected to an "i"-th I/O line whereas the second page buffer is connected to an "i+1"-th I/O line (i=0, 2, 4, 6 ... ). Where the column selecting circuit of FIG. 10 is applied to such a multi-state NAND-type memory device, it is desirable for the I/O-divided configuration to be modified so that adjacent ones of eight independent I/O blocks are merged to form four I/O blocks. The column selecting unit should thus be modified to carry out operations of reading data from the merged I/O configuration and loading data when programming the data in a selected cell.

Accordingly, there continues to exist a need in the art for improved multi-state non-volatile semiconductor memory devices and methods.

SUMMARY OF THE INVENTION

It is therefore an object of the present invention to provide improved non-volatile semiconductor memory devices.

It is another object of the present invention to provide non-volatile memory devices having improved memory capacity.

These and other objects according to the present invention are provided by a multi-state non-volatile semiconductor memory device including a plurality of parallel bit lines, a plurality of parallel word lines, and a plurality of memory cell strings. The memory cell strings are arranged in a matrix wherein each of the strings includes a plurality of series connected memory cells. Each of the memory cells is coupled to a respective word line, and each of these memory cells includes a control gate, a floating gate, and source and drain regions spaced from each other by a channel so that multi-state data can be stored in each of the memory cells. Each of a first plurality of selection transistors includes a drain connected to a respective bit line and a source connected to a first side node of a respective memory cell string. Each of a second plurality of selection transistors includes a source connected to a common source line and a drain connected to a second side node of a respective memory cell string.

A bit line selection and charge means is coupled to each of the plurality of bit lines so that the parallel bit lines are divided into bit line groups of alternating bit lines. The bit line selection and charge means selects a first one of the bit line groups in response to a bit line signal and charges a second one of the bit line groups to a program inhibit voltage so that the first group can be accessed in operation modes for programming data to be stored in each memory cell. Accordingly, the program data has a desired logic state selected from a plurality of logic states for reading the program data, for erasing the program data, and for verifying program and erasing of the data. A row decoder is coupled to the word lines and the gates of the first and second pluralities of selection transistors. The row decoder generates a control signal on a selected word line to control respective memory cells connected to the selected word line during programming and reading operations.

A static current supply unit is connected to each of the bit lines and supplies a static current to the selected bit lines. A storage means is coupled to the bit line selection and charge means. The storage means temporarily stores program data and writes the stored program data to memory cells of strings connected to the selected bit lines at one time during programming operation while latching data sensed and read from selected memory cells during a reading operation.

A storage control means inverts and maintains a state of data latched in the storage means in accordance with a level of each selected bit line in response to a control signal applied thereto during a reading operation. An initialization means is connected to each of the bit lines wherein the initialization means initializes the storage means before execution of a reading operation in response to a control signal applied thereto while maintaining each bit line at a predetermined voltage level.

A programmed data transmission means is coupled between the storage means and the bit line. The programmed data transmission means transmits the data latched in the storage means to the selected bit line.

The memory devices of the present invention thus provide improved non-volatile memories capable of storing multi-state data in each memory cell.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
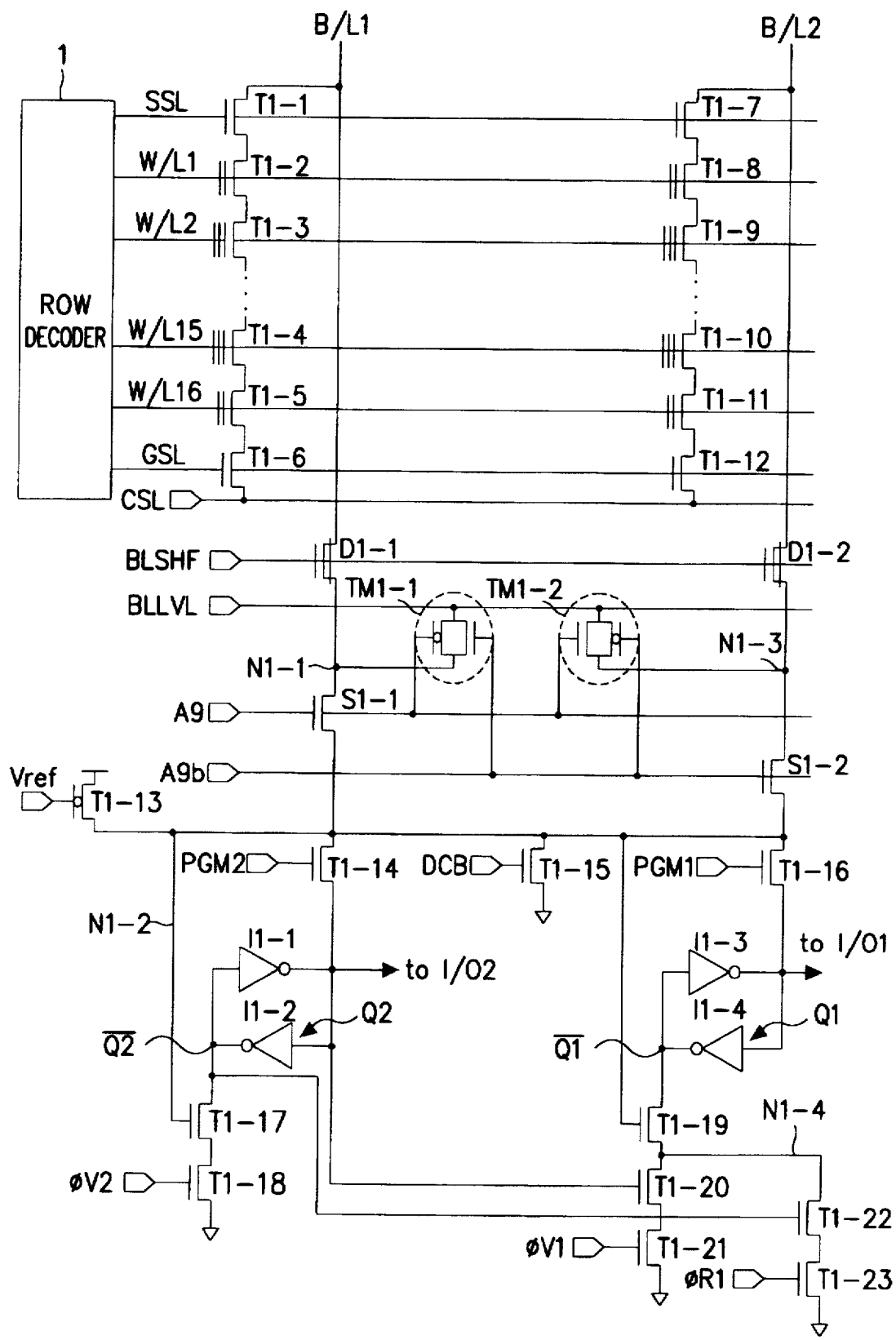
FIG. 1 is a circuit diagram illustrating a memory device wherein information of two bits per memory cell is stored using NAND-type flash-EEPROM cells according to the present invention.

FIG. 1 is a circuit diagram illustrating a memory device according to the present invention wherein two bits of information per memory cell are stored using NAND-type flash-EEPROM cells. In addition to flash EEPROMs, the memory device illustrated in FIG. 1 can be formed using mask ROMs, EPROMs, and EEPROMs. The application of this memory device can also be extended so that more than two bits of information are stored per memory cell.

The memory device of FIG. 1 includes two memory cell strings each having a plurality of series-connected memory cells. Two bit lines, associated with respective memory cell strings, are illustrated wherein these bit lines belong to different groups. As will be understood by one having skill in the art, larger numbers of memory cell strings and respective bit lines can be used. In FIG. 1, the memory cells of each string are labelled T1-2 to T1-5 or T1-8 to T1-11, respectively. A selection transistor, T1-1 or T1-7, is coupled between each string and the associated bit line. The selection transistor is selectively switched on to couple the associated string and bit line together. Another selection transistor, T1-6 or T1-12, is arranged between each string and a common source line CSL to selectively switch the connection between the string and common source line CSL. A depletion transistor, D1-1 or D1-2, is also coupled to each bit line to inhibit an application of high voltage.

A bit line selection transistor, S1-1 or S1-2, is also connected to each bit line. Each bit line selection transistor selects a respective bit line in response to a bit line selection signal, A9 or A9b. A signal line BLLVL is connected to each of the bit lines via transmission transistors TM1-1 and TM1-2. Each transmission transistor applies a signal BLLVL from the signal line BLLVL to the associated bit line in response to the bit line selection signals A9 and A9b applied thereto when the bit line is not selected. The signal BLLVL supplies a program inhibit voltage (for example, the supply voltage Vcc) to the unselected bit line during programming and reading operations while floating during the erase operation. A transistor T1-13 is also connected to the bit lines to supply static current to the selected bit line during the read operation. The memory device of FIG. 1 also includes latch-type sense amplifiers I1-1 and I1-2 (or I1-3 and I1-4) associated with each bit line. The sense amplifiers latch externally-applied data during the programming operation, supply a voltage corresponding to the latched data to the associated bit line, and latch the data read during the read operation.

A plurality of transistors T1-17, T1-18, T1-19, T1-20, T1-21, T1-22 and T1-23 are provided, and these transistors invert or maintain latch states of the sense amplifiers in accordance with a bit line level selected during the reading operation. This function is controlled by latch enable signals φV2, φV1 and φR1. These latch enable signals are enabled in the form of a pulse at the point in time when an inversion in latch state is required after a predetermined time has elapsed since the beginning of the reading operation. A transistor T1-15 is also connected to the bit lines. The transistor T1-15 initializes the latches just before the execution of the read operation while maintaining the bit lines at a ground voltage state. The transistor T1-15 is controlled by a signal DCB.

Transistors T1-14 and T1-16 are coupled to respective bit lines. These transistors T1-14 and T1-16 turn on when the programming operation is executed, thereby transmitting the latched data to the respective bit lines. The transistors T1-14 and T1-16 are respectively controlled by control signals PGM1 and PGM2. Each string is connected to a plurality of word lines, thereby forming a block. Accordingly, the whole memory array consists of a plurality of blocks arranged as a matrix. The selection of a particular word line is achieved by a combination of a decoding operation for selecting a block corresponding to given addresses and a decoding operation for selecting one of the word lines in the string corresponding to the selected block. The data erasing, reading, programming, and program verifying operations in accordance with the present invention will now be described.

Figure 2:
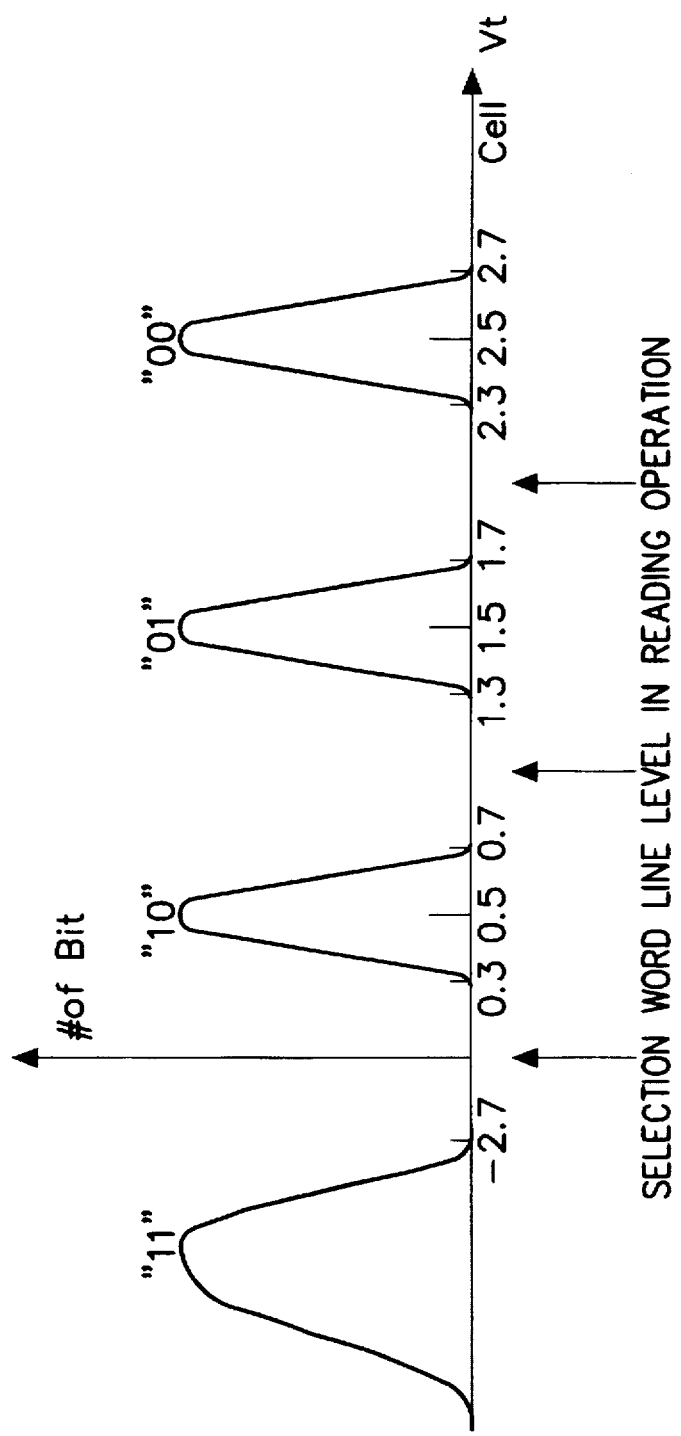
FIGS. 2 and 3 are graphs illustrating threshold voltage distributions for the memory cells of FIG. 1 as a function of data stored therein with selection word line levels used in reading and program verifying operations.
Figure 3:
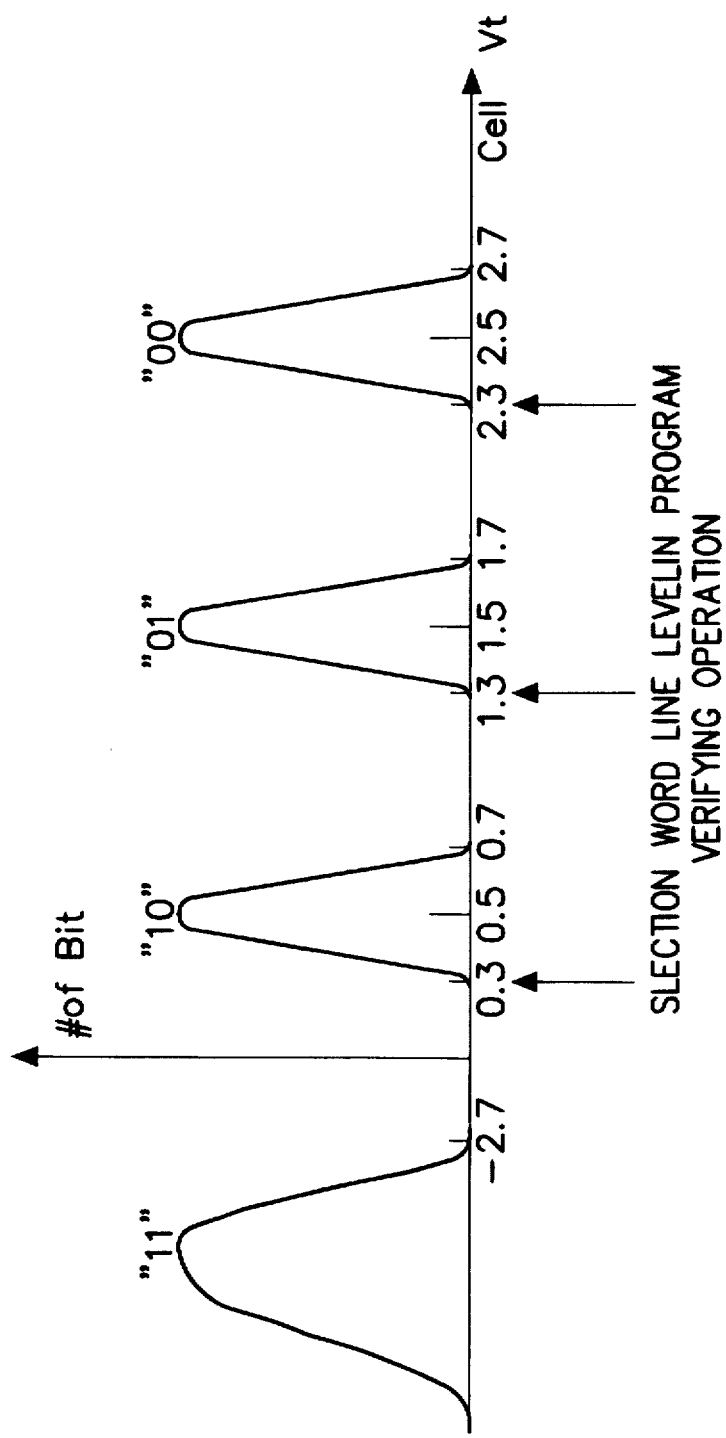

FIGS. 2 and 3 show threshold voltage distributions for memory cells as a function of programmed data. In order to distinguish such threshold voltage distributions from one another, different voltages are sequentially applied to a selected word line during the read operation while the different voltages are applied at intermediate values between adjacent threshold voltage distributions, as shown in FIG. 2. Using an effective programming method, it is possible to obtain four different threshold voltage distributions respectively ranging from below −2.7V, from 0.3V to 0.7V, from 1.3V to 1.7V, and from 2.3V to 2.7V. Based on these threshold voltage distributions, data can be stored in four different states in one memory cell.

I. Reading Operation

Figure 4:
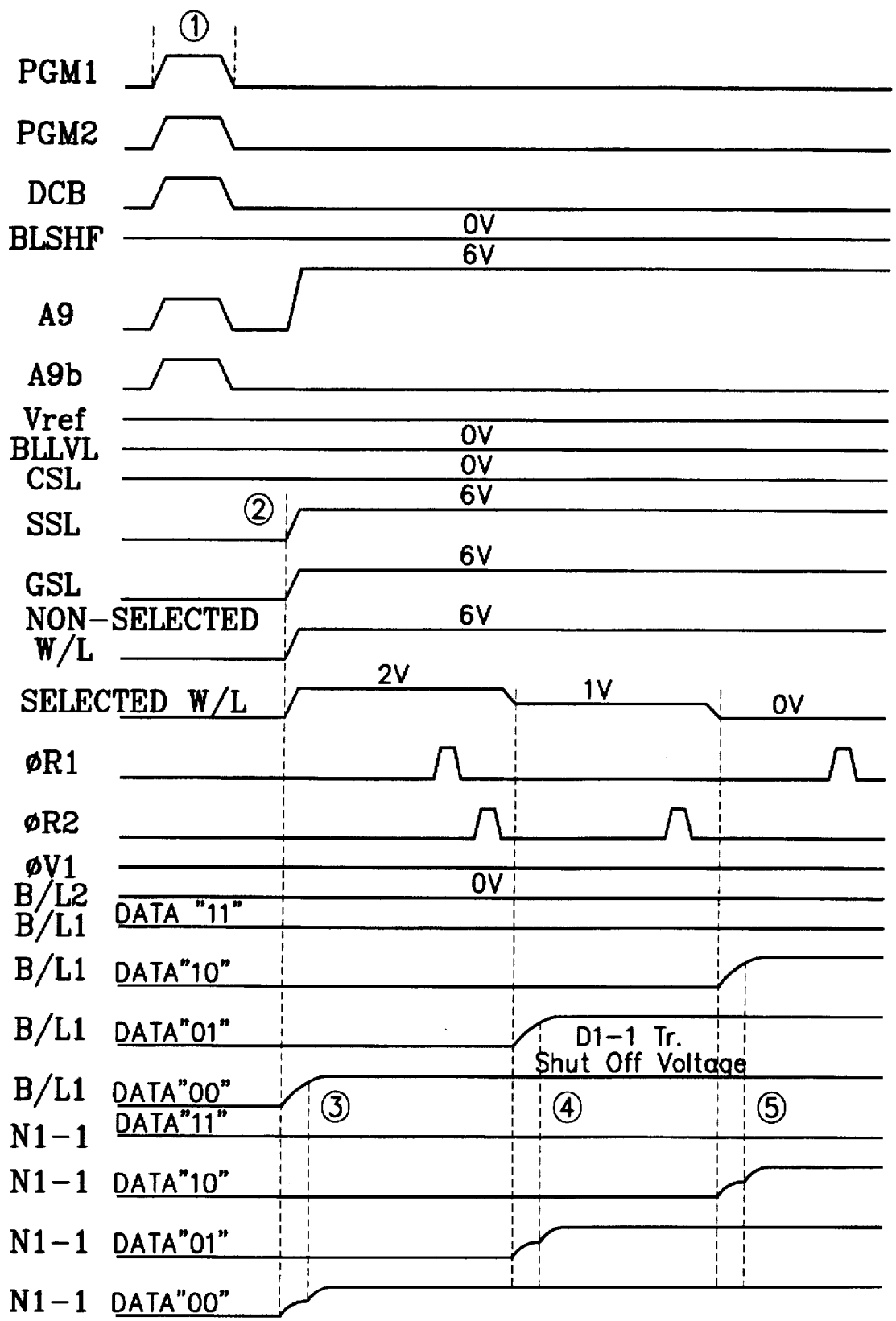
FIG. 4 is a timing diagram illustrating a reading operation for the memory device of FIG. 1.

The read operation is started by resetting both latches as shown in time interval (1) of FIG. 4. Then, a selected one of the signals A9 or A9b (signal A9 in FIG. 4) increases in level to a pumping level of about 6V at an operating voltage of 3.3V in accordance with a given address signal. A corresponding one of the two bit lines B/L1 and B/L2 is thereby selected. The read operation will now be discussed under the condition wherein the bit line B/L1 is selected.

The remaining signal A9b, which is a complementary signal of the signal A9, is maintained at a "Low" level. As a result, the signal BLLVL, which is biased to a low level, is applied to the unselected bit line via the transmission transistor TM1-2, thereby causing the unselected bit line to be maintained at the ground voltage level. Accordingly, the unselected bit line is no longer floating. An unselected bit line thus serves as a shield line between two adjacent selected bit lines as it is always maintained at the ground voltage level. The adjacent selected bit lines are thereby inhibited from being coupled to each other. At this time, a voltage Vref of a predetermined level is applied to the gate of the transistor T1-13 shown in FIG. 1 to supply a bit line current required for a sensing operation. The voltage Vref is generated from a reference voltage generating unit as will be understood by those having skill in the art.

Referring to FIG. 4, waveforms of signals associated with the read operation are illustrated. The row decoder 1 generates a string selection signal SSL and a ground selection signal GSL in response to a given row address, thereby selecting a desired block. At this time, a voltage Vpass of a pumping level (for example, 6V) is applied to unselected word lines. The data stored in a selected memory cell is sensed for three cycles. At this time, the word line level selected varies in the order of 2V→1V→0V at a predetermined sensing time interval of, for example, 8 uS. The word line level at which memory cells turn off varies in accordance with the threshold voltage level of the selected memory cell. The point in time when the node N1-1 between the transistor TM1-1 and the associated bit line charges to the source level Vcc also depends on the threshold voltage level of the selected memory cell. When data latch signals $\phi$R1 and $\phi$V2 are selectively applied to associated transistors at each word line level, as shown in FIG. 4, it is possible to sense four different cell data outputs. This operation will now be described in detail.

The first cycle, which is executed at a word line voltage level of 2V, is the step of sensing data "00". Referring to the threshold voltage distributions shown in FIGS. 2 and 3, it can be found that at the word line level of 2V, cells programmed with data values other than data "00" are in the turn-on state. At this word line level, there is no variation in the data in the latches because the data latch signals $\phi$R1 and $\phi$V2 can not turn on the associated transistors T1-17 and T1-22 even if enabled in the form of pulses. A cell transistor is in its turn-off state if it has a threshold voltage associated with data "00". Due to the turn-off state of this cell transistor, an increase in selection bit line voltage level occurs.

The selection bit line level increases due to the shut-off level of the transistor D1-1. When the selection bit line level reaches the shut-off level, the transistor D1-1 is switched to its OFF state. In this state, the electrical charge supplied through the transistor T1-13 rapidly charges the node N1-2, which has a smaller load than the bit line, to the supply voltage level Vcc. As a result, the transistors T1-17 and T1-22 turn on at the point in time when the data latch signals $\phi$R1 and $\phi$V2 are enabled in the form of pulses, so that the states of the latches Q1 and Q2 are inverted. Where the latch Q2 is inverted to its low state before the inversion of the latch Q1, the transistor T1-22 is switched to its OFF state so that the latch Q1 can not be inverted. Accordingly, the signal $\phi$R1 is enabled before the enabling of the signal $\phi$V2. In this way, the latch Q1 is first inverted, and then the latch Q2 is inverted.

At the selection word line voltage level of 1V, memory cells having a threshold voltage corresponding to the data value "01" are recognized to be in their turn-off state. In this case, the node N1-1 increases in level to the level Vcc in the interval (4) of FIG. 4. In this interval, only the signal $\phi$V2 is enabled, thereby causing only the latch Q2 to be inverted to its low state. In the low state of the latch Q2, the transistor T1-22 is still maintained in its OFF state even when the signal $\phi$R1 is enabled in the interval (5). As a result, the latch state sensed in the interval (4) is still maintained.

At the selection word line voltage level of 0V, the memory cells having a threshold voltage corresponding to data "10" are recognized to be in their turn-off state. In this case, the node N1-1 increases in level to the level Vcc in the interval (5) of FIG. 4. In this interval, only the signal $\phi$R1 is enabled, thereby causing only the latch Q1 to be inverted to its low state. On the other hand, the cells associated with data "11" are maintained at their turn-on state during the entire sensing interval because they have a threshold voltage of less than −2.7V. The node N1-2 is thus maintained at a level below the turn-on voltage level of the transistors T1-17 and T1-22, there is no variation in the latched data.

II. Programming and Program Verification

Figure 5:
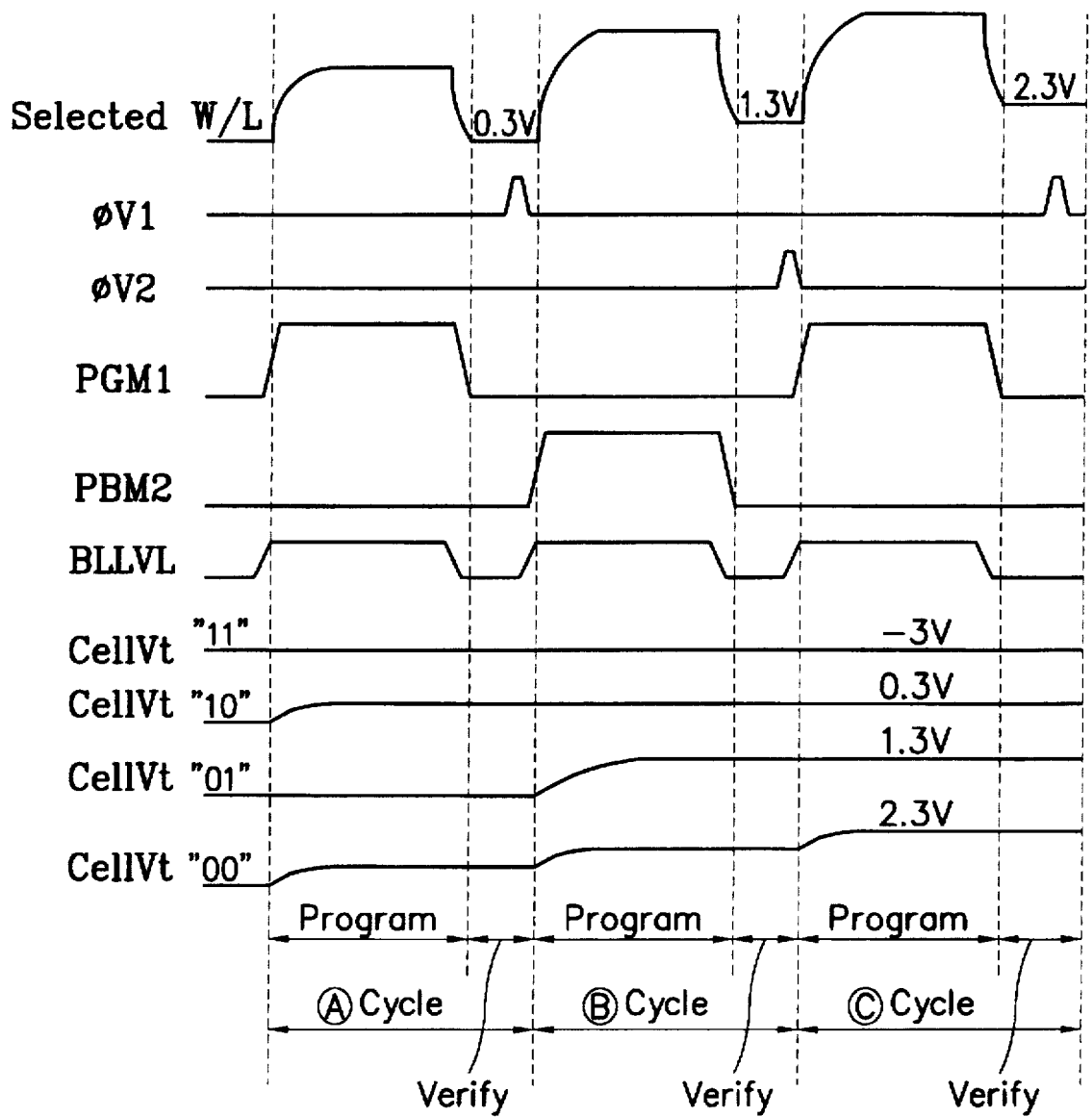
FIG. 5 is a timing diagram illustrating signals associated with programming and program verifying operations of the memory device of FIG. 1.
Figure 6:
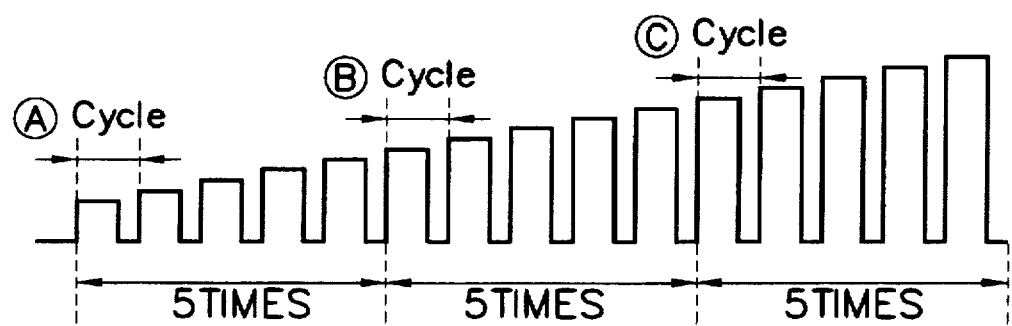
FIG. 6 is a waveform diagram illustrating a voltage applied to a selected word line of FIG. 1 during programming and program verifying operations.
Figure 7A:
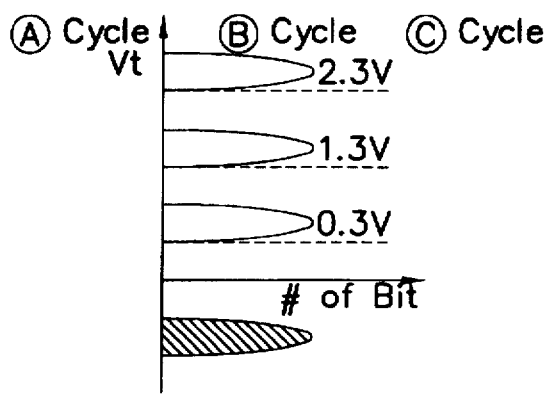
FIGS. 7 and 8 illustrate a variation in a threshold voltage as a function of a data state of a memory cell of FIG. 1 during a programming operation.
Figure 7B:
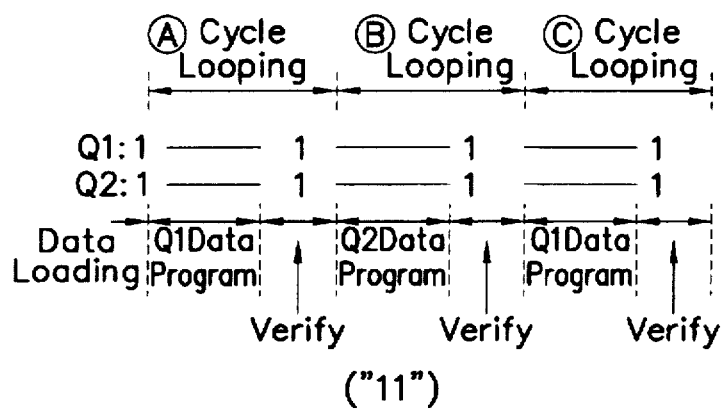
Figure 7C:
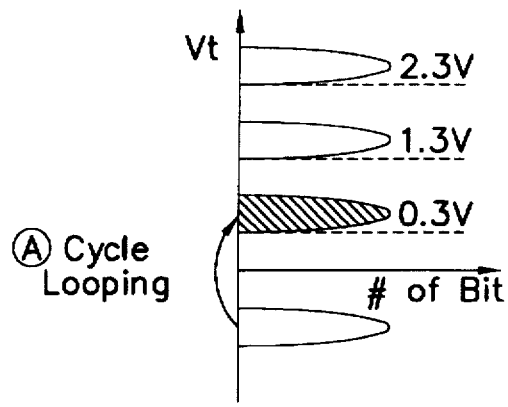
Figure 7D:
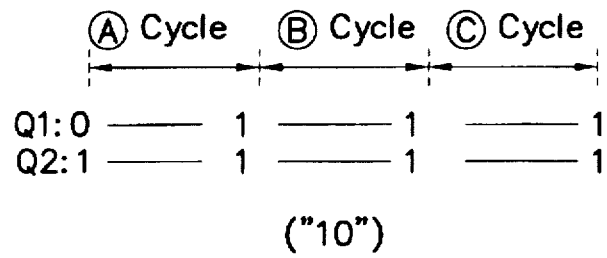
Figure 8A:
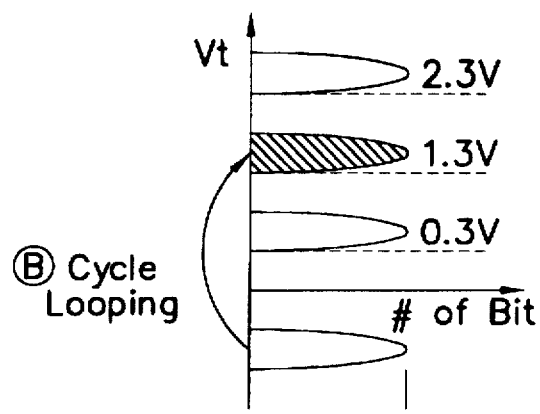
Figure 8B:
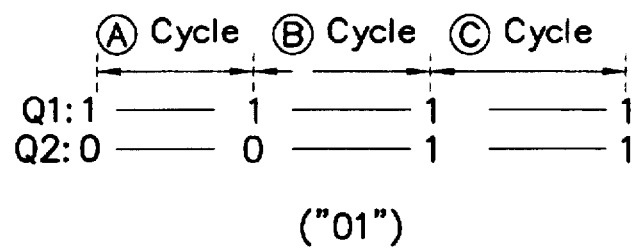
Figure 8C:
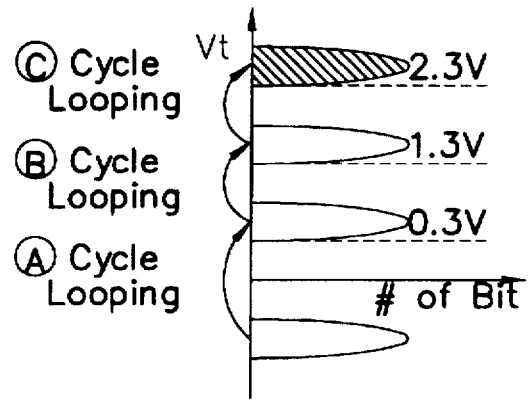
Figure 8D:
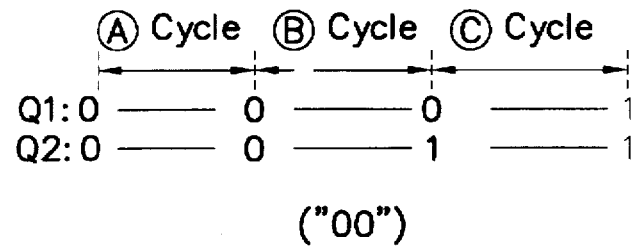

Referring to FIGS. 5 and 6, waveforms of signals associated with the programming and program verifying operations are illustrated. The program cycle includes a programming operation, in which electrons are injected into floating gates of memory cells, and a program verifying operation, in which it is verified whether or not each programmed memory cell has a desired threshold voltage. The programming and program verifying operations are repeated until all the selected memory cells have desired threshold voltages. The number of times these operations are repeated may be limited to an appropriate value internally determined in the memory device. In order to execute a program utilizing Fowler Nordheim tunneling in a selected memory cell, a high voltage as a predetermined program voltage (for example, 14 to 19V) is applied to the gate of the cell while the channel of the cell is maintained at the ground voltage level.

Accordingly, a relatively strong electric field is exerted between the floating gate and channel. By virtue of such an electric field, a tunneling occurs between the floating gate and channel through an oxide film formed between the floating gate and channel. Electrons existing in the channel thus migrate toward the floating gate, so that these electrons accumulate in the floating gate. The accumulation of electrons in the floating gate results in an increase in the threshold voltage of the cell. In the case of a memory device consisting of a plurality of data cells, programming operations for the data cells are not individually carried out, but simultaneously carried out. However, the memory cells may require different threshold voltages, namely, different programmed degrees. For this reason, it may be necessary to verify whether or not the memory cells reached their desired states, after the execution of one programming operation (Program Verification), and to execute another programming operation for incompletely programmed memory cells without affecting the completely programmed memory cells (Program Inhibition). These programming and program verifying operations are repeated until all the selected memory cells reach their desired threshold voltages. In the memory device of FIG. 1, only the half of memory cells connected to a selected word line are programmed as discussed above.

When one of two bit lines is selected in accordance with the bit line selection signals A9 and A9b, the supply voltage Vcc from the line BLLVL is applied to the unselected bit line, thereby inhibiting the memory cells associated with the unselected bit line but connected to the selected word line from being programmed. This programming inhibit technique including the application of a supply voltage to unselected bit lines will be understood by those having skill in the art.

Externally-supplied program data is applied to the two latch circuits for two bit lines in the programming operation. When a cell from the memory device of FIG. 1 is programmed and has a threshold voltage level corresponding to the data received in the latch circuits, the latches Q1 and Q2 are inverted to the high state. The completely programmed memory cells are then charged with the supply voltage Vcc. Accordingly, the threshold voltage of the completely programmed memory cells is not influenced by the programming operation which is subsequently conducted for incompletely programmed cells.

The programming and program verifying operations will now be described in detail with reference to the timing diagrams shown in FIG. 5. The cycle (a) in FIG. 5 is a cycle including one programming interval and one program verifying interval. In this program cycle, programming is carried out based on data latched in the latch Q1. The cycle (a) is repeated by a number of repetitions (for example, 5 times) determined when designing the memory device. Each program operation uses a program voltage incremented from that used in the prior programming operation by an increment (for example, 0.2V) determined when designing the memory device (FIG. 4B). This technique for incrementing a program voltage will be understood by those having skill in the art.

In the program verifying operation, a sensing operation is carried out which is similar to the above-mentioned reading operation. In the sensing operation, however, a voltage, which is higher than the selection word line voltage used in the reading operation, is used to obtain a margin between the selection word line voltage and the threshold voltage, as shown in FIG. 2.

In the cycle (a), programming is executed for data latched in the latch Q1. In the program verifying operation following the programming operation of the cycle (a), a latch enable signal associated with the latch Q1 is used. This latch enable signal is $\phi V2$. The programming operation is completed after the loop of the cycle (b) is ended. In FIG. 5, a variation in program voltage occurring during the execution of the loop of each cycle is illustrated. FIGS. 7 and 8 show a variation in threshold voltage and a variation in latch state during the execution of the loop of each cycle.

For the data value "11", a programming inhibition state is maintained during the entire programming interval. This inhibition state is maintained because the data latched in both latches Q1 and Q2 are "1", thereby charging the bit lines to the supply voltage level. For the data value "10", the program operation is carried out only when the program loop is executed in the interval associated with the data latched in the latch Q1 because only the data latched in the latch Q1 is "0". In intervals following the programming interval associated with the data latched in the latch Q1, no programming is performed because the programming inhibition state is maintained. For the data value "01", no programming is executed in the initial program loop interval associated with the data latched in the latch Q1. This is because the data latched in the latch Q1 is "1". Programming begins as the program loop associated with the data latched in the latch Q2 starts. When the threshold voltage of the associated memory cell reaches a desired level during the execution of the program loop, the data latched in the latch Q2 is changed to the data value "1". As a result, the programming inhibition state is maintained in the remaining intervals of the program loop. Accordingly, there is no further programming.

On the other hand, for the data value "00", programming is carried out during the entire interval of the program loop associated with the data latched in the latch Q1. This is because even when the threshold voltage of the memory cell is higher than 0.3V, that is, the reference voltage for the program verification, the data value "1" of the latch Q1 is unchanged due to the OFF state of the transistor T1-20 (FIG. 1) resulting from the data value "0" of the latch Q2. When memory cells have a relatively high programming speed, these memory cells may often have a threshold voltage of 0.7V or more. Thereafter, the program loop for the data of the latch Q2 is executed.

When the threshold voltage of the memory cell increases to 1.3V or more, the data latched in the latch Q2 is changed to the data value "1" during the program verification operation, so that the programming inhibition state is obtained. However, the memory cell is still maintained in a state in which the threshold voltage thereof is lower than a level associated with the data value "00". The threshold voltage of the memory cell increases toward a higher positive (+) value as the program loop for the data latched in the latch Q1 is executed. When the threshold voltage corresponds to 2.3V or more, the data of the latch Q1 is changed to "1". As a result, the programming inhibition state is maintained during the remaining intervals of the program loop. Accordingly, there is no further programming, and programming is completed.

III. Erasure and Erasure-verification

Figure 9:
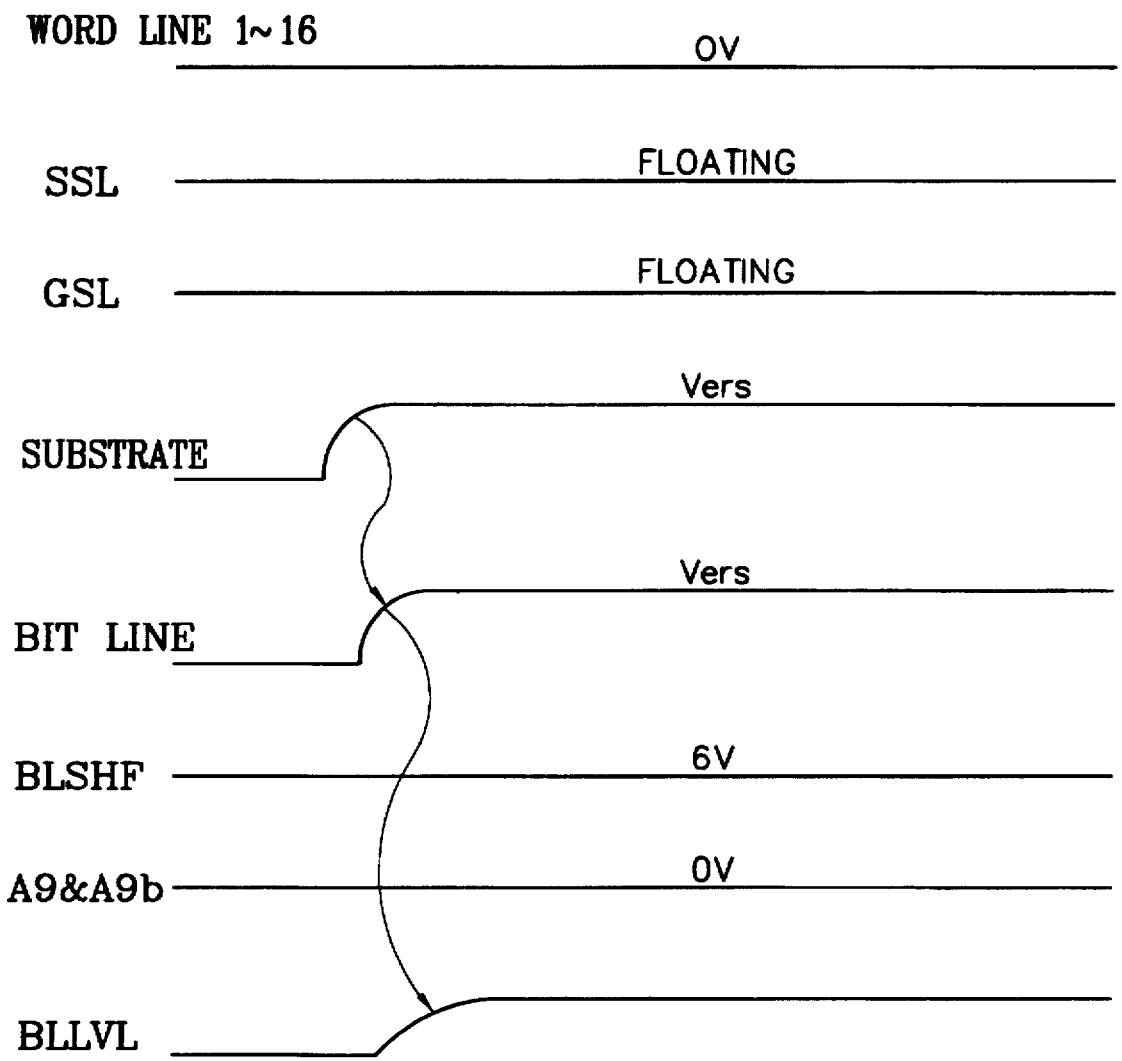
FIG. 9 is a timing diagram illustrating an erasing operation for the memory device of FIG. 1.
Figure 10:
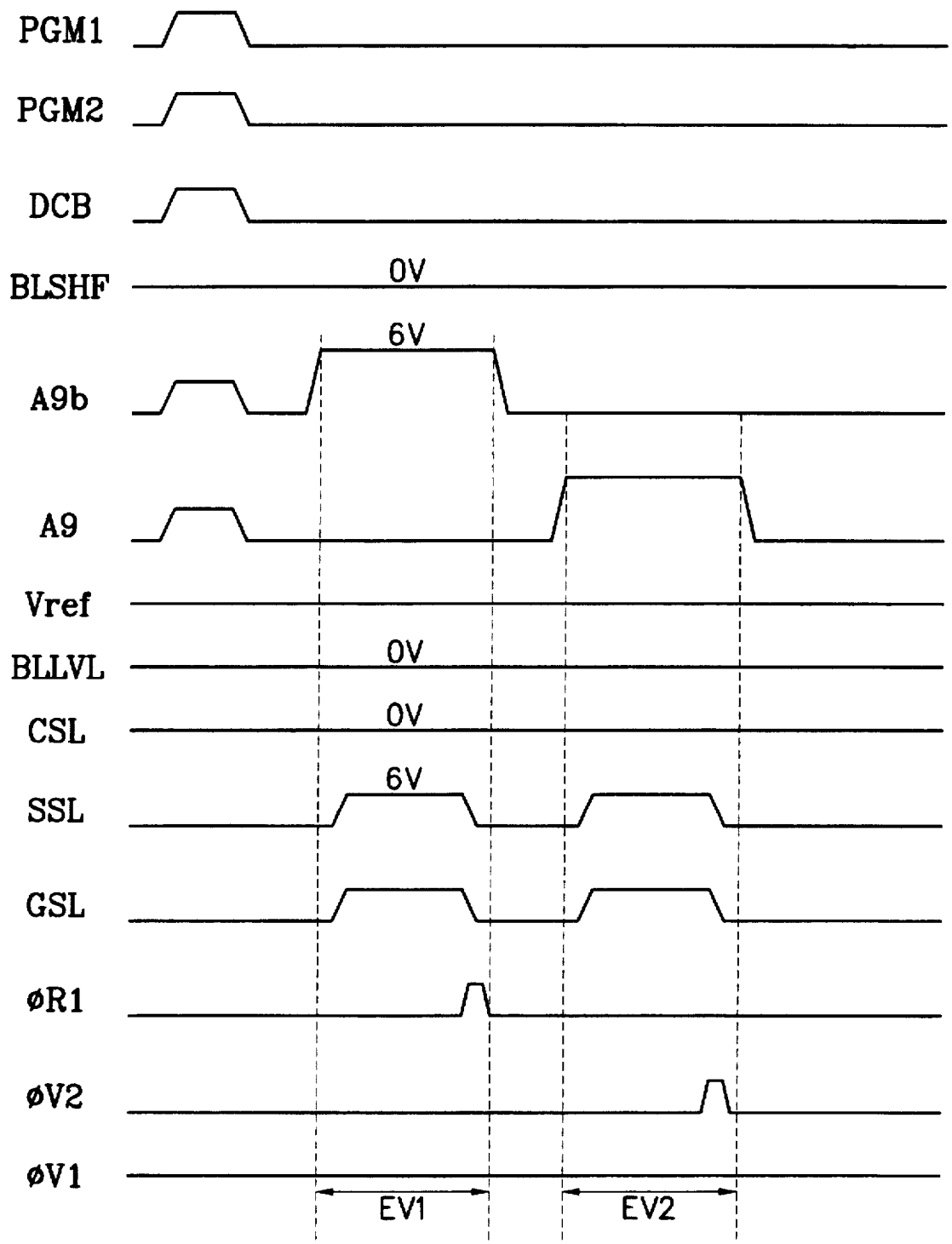
FIG. 10 is a timing diagram illustrating an erasure verifying operation for the memory device of FIG. 1.

FIGS. 9 and 10 illustrate waveforms of essential signals for the data erasing and erasure verifying operations associated with the circuit of FIG. 1. The erasing operation is executed by blocks. In the erasing operation, the string selection line SSL and ground selection line GSL are in a floating state while a voltage of 0V is applied to the word lines of a selected block. The erasing operation is carried out simultaneously for memory cells connected to the selected word lines.

At this time, a data erasing voltage Vers (typically, 21 to 24V) is applied to a substrate on which the memory cells are formed. As a result, a relatively strong electric field is exerted between the substrate and the floating gate of each memory cell. This electric field generates Fowler Nordheim tunneling, thereby causing electrons stored in the floating gate to migrate toward the substrate. Accordingly, the threshold voltage of the selected memory cell varies toward a negative (−) value. The erasing/erasure verifying operation is continuously carried out until the selected memory cells have desired threshold voltages, similar to the programming/program verifying operation. The erasing/erasure verifying operation is continuously carried out by repetitively executing an erasing operation and an erasure verifying operation.

Waveforms of signals used during the erasing operation are shown in FIG. 9. When a high data erasing voltage is applied to the substrate, as mentioned above, the transistor T1-1 in the memory device of FIG. 1 is forward biased at the P-N junction of its source. Accordingly, the bit line level increases to the erasing voltage. In the erasing operation, the PMOS transistors TM1-1 and TM1-2 of FIG. 1 are in their turn-on state because the bit line selection signals A9 and A9b are at the ground voltage level while the control signal BLSHF is at a biased level (for example, 6V). At this time, the nodes N1-1 and N1-3 are induced with a voltage corresponding to the sum of the voltage level of the signal BLSHF and the threshold voltage of the depletion transistor D1-1.

At this time, the signal BLLVL is in a floating state. Accordingly, the voltage from the nodes N1-1 and N1-3 induces a BLLVL voltage. Waveforms of signals used in the memory device of FIG. 1 during the erasure verifying operation are shown in FIG. 10. For the erasure verifying operation, signals SSL and GSL, which are 6V, are applied to a selected block whereas a voltage of 0V is applied to all word lines in the selected block. Although the erasure verifying operation is similar to the reading operation, the erasure verifying operation is different from the reading operation in that the bit line level is determined by all memory cells existing in the associated string. Because the erasing operation is executed simultaneously for all bit lines in the selected block, as mentioned above, the erasure verifying operation should also be executed for all the even and odd bit lines. For this reason, the erasure verifying operation involves two reading operations, as shown in the timing diagram of FIG. 10.

For the erasure verifying operation, the bit line B/L2 is first selected in accordance with the bit line selection signal A9b of a high level in a latch reset state. Under this condition, the erasure verifying operation begins. When all the cells existing in the string coupled to the bit line B/L2 are in a data-erased state, all transistors thereof are recognized to be in an "ON" state at the word line level of 0V. Accordingly, the node N1-1 is recognized as being at a "Low" level, so that it is maintained in a "Pass" state. Alternately, if the string includes one or more cells from which data has been incompletely erased, then the node N1-1 is switched to a "High" level. Under this condition, the latch Q1 is inverted to a "High" state when the latch enable signal φR1 is enabled. In this case, the node N1-1 is in a "Fail" state, that is, an erasure fail state.

The procedure discussed above is executed for the other bit line B/L1 as the bit line selection signal A9 of a high level is applied. The erasure verification is a reading operation for only the erased data "11". Accordingly, this operation can be achieved by reading out only one kind of data from the one bit line. Therefore, it is possible to store the result of the reading operation in the latch of the associated bit line. Heretofore, the operation of the memory device according to the present invention has been described.

Figure 11:
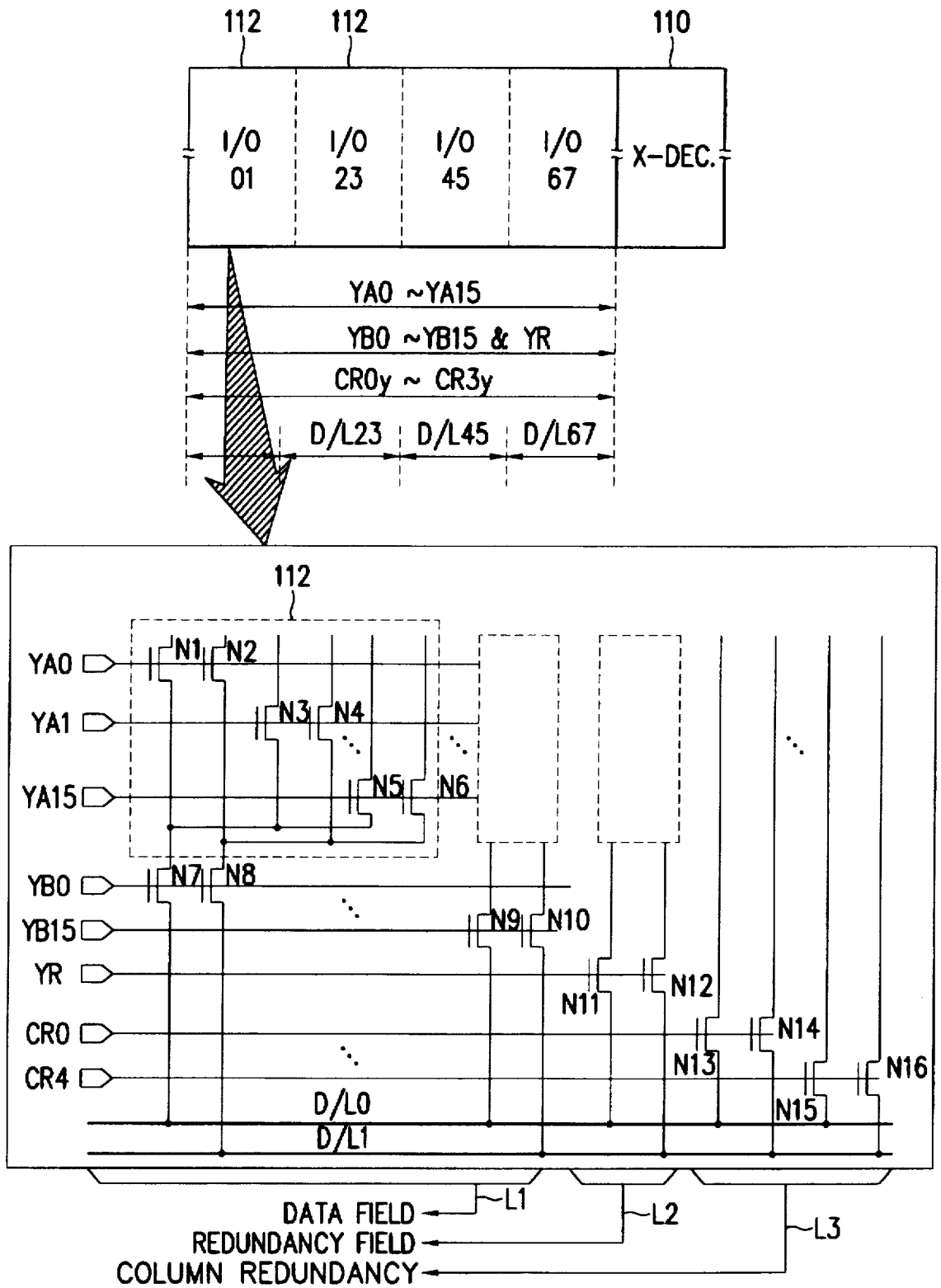
FIG. 11 is a circuit diagram illustrating a column selecting circuit which can be connected to the memory device of FIG. 1 according to the present invention.
Figure 12:
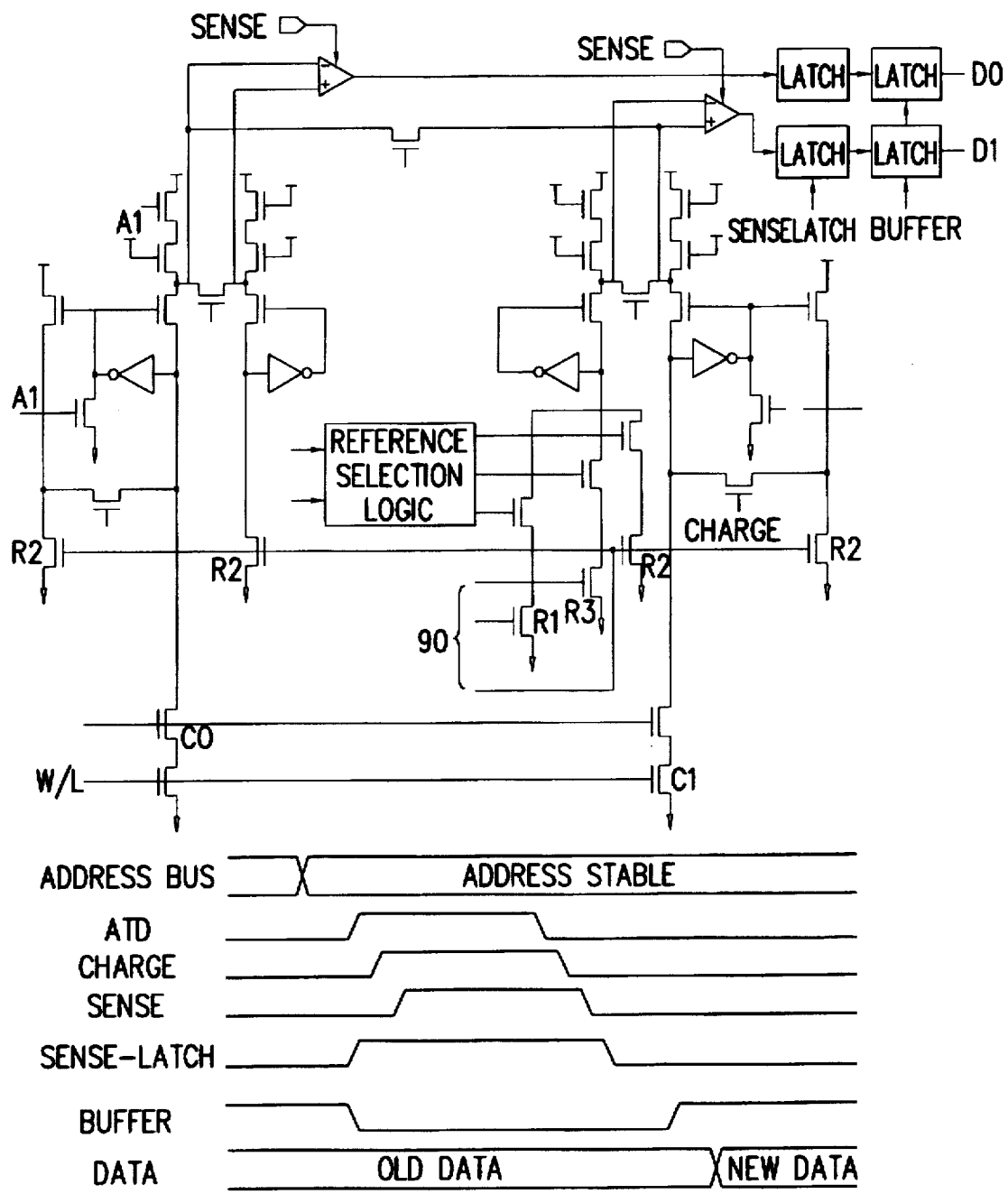
FIG. 12 is a circuit diagram illustrating a current sense amplifier for a NOR-type multi-state memory device and an associated timing diagram according to the prior art.
Figure 13:
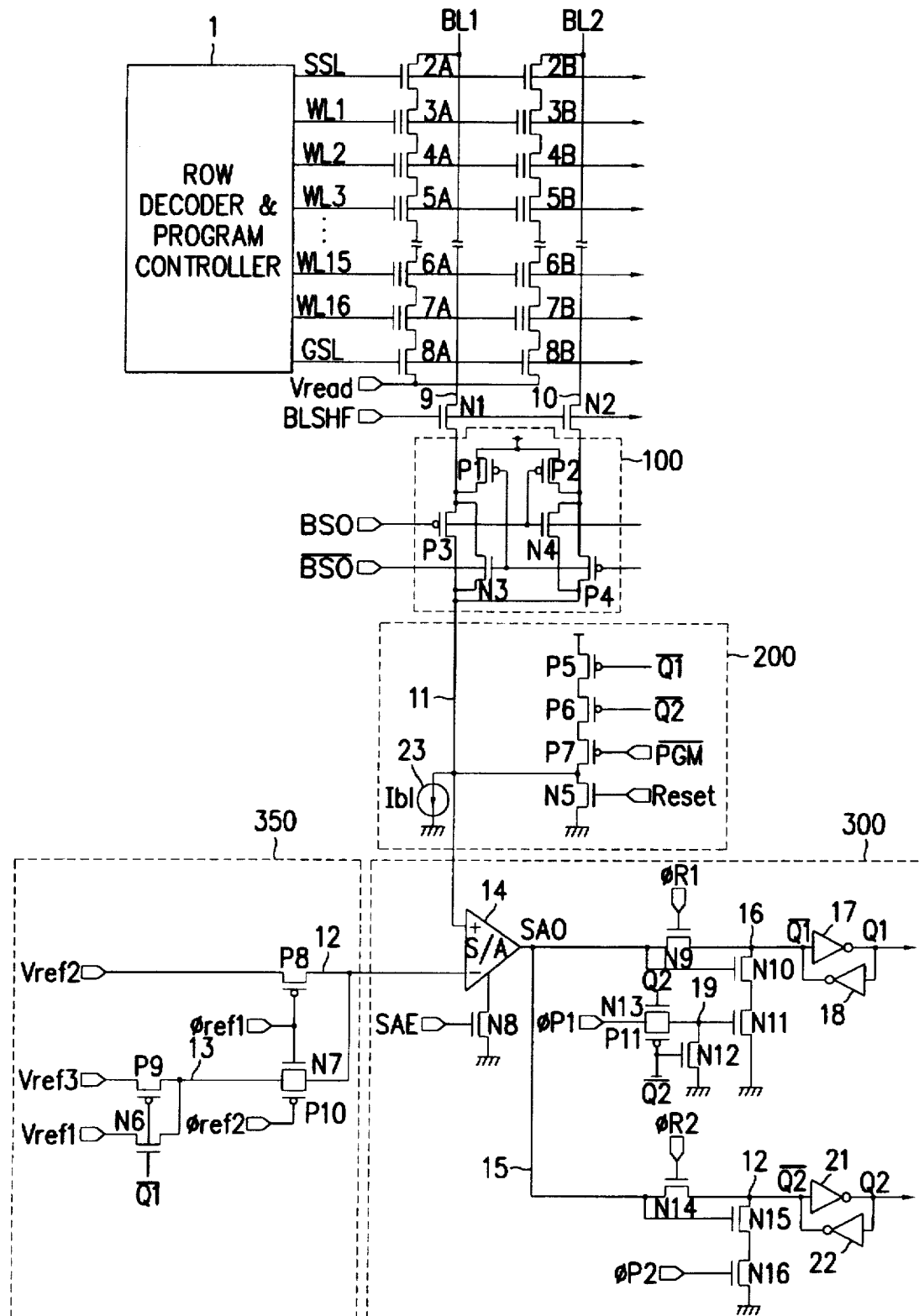
FIG. 13 is a circuit diagram illustrating a connection between a sense amplifier and a NAND-type multi-state memory device according to the prior art.
Figure 14A:
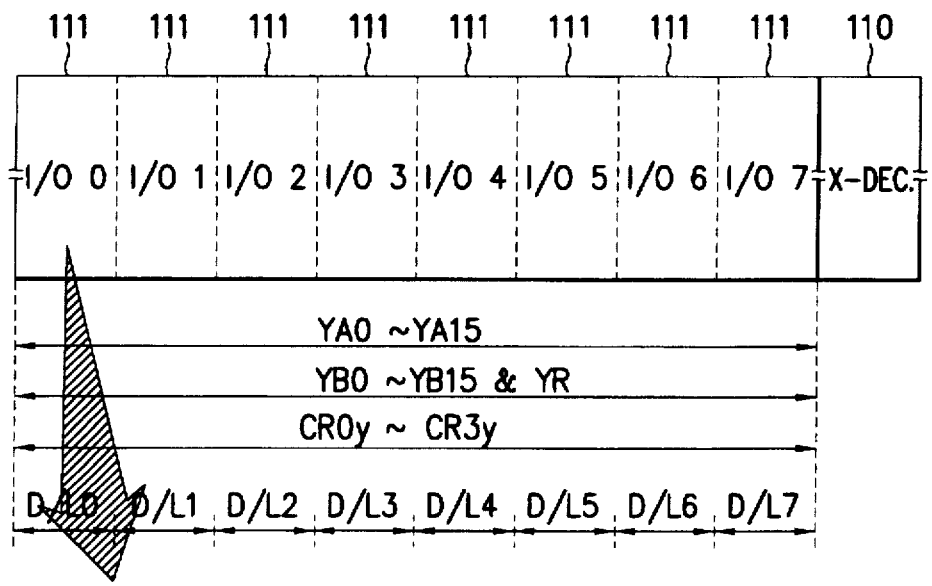
FIG. 14 is a circuit diagram illustrating a column selecting circuit according to the prior art.
Figure 14B:
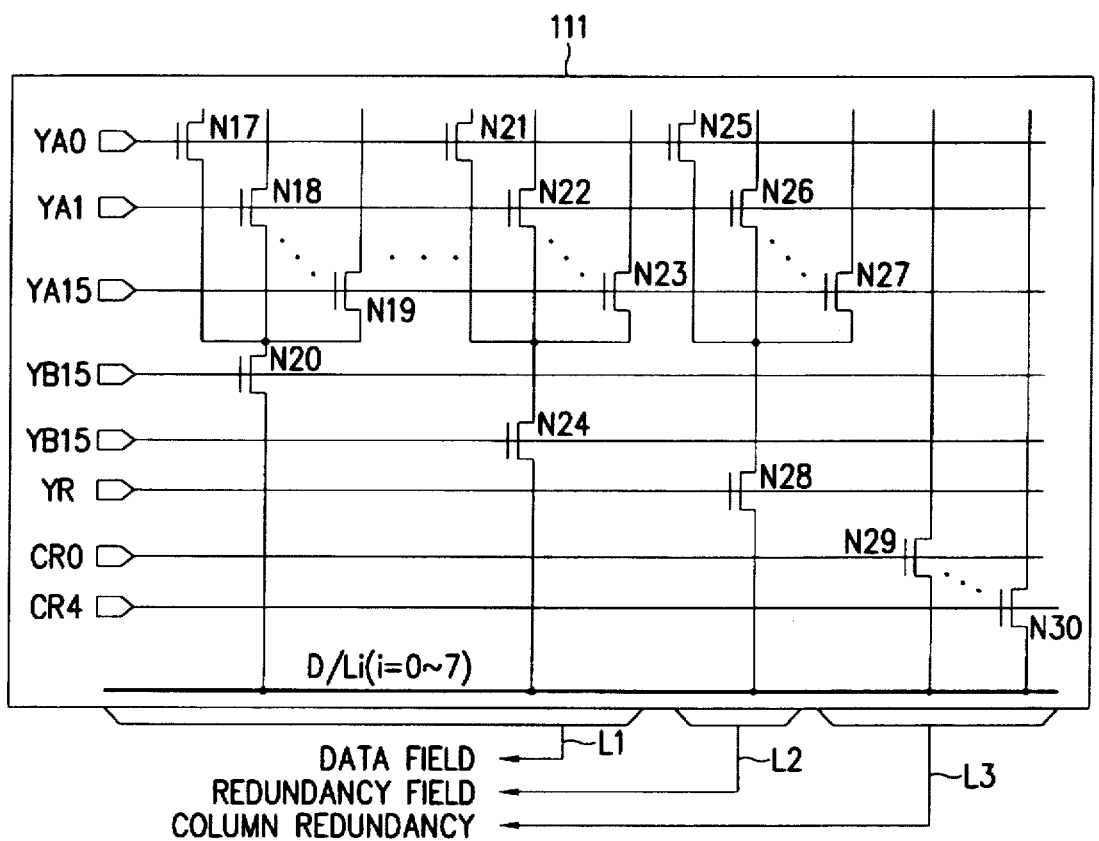

FIG. 11 is a circuit diagram of a column selecting circuit for performing data reading and data loading associated with merged I/O blocks according to the present invention. The configuration of FIG. 11 is suitable for integrated circuit memory devices in which adjacent two page buffers (namely, latches) are selected by the same selection address. The column selecting circuit includes latches corresponding to independent I/O lines. Each latch is connected to each bit line and adapted to read out data from memory cells, thereby latching the read data. The column selecting circuit also includes a first NMOS transistor (for example, N1 in FIG. 11) as a switching means connected in series to each latch and adapted to receive a pre-decoded signal associated with a row selection address at the gate thereof, a second NMOS transistor (for example, N7 in FIG. 11) as a switching means connected in series to the first NMOS transistor and adapted to receive a pre-decoded signal associated with another row selection address, and a signal line as a means connected in series to the second NMOS transistor to perform a data transmission. The configuration of each latch is illustrated in FIG. 1. In FIG. 11, the reference character YR denotes a signal for selecting a redundancy field of the memory cell array whereas the reference characters CR0 to CR4 denote signals for selecting a column redundancy used to repair a failed bit line.

Each merged I/O block 112 is selectively coupled to two associated bit lines. The coupling of the merged I/O block 112 to a selected one of the bit lines is obtained based on a bit line selection address. The merged I/O block 112 reads information of 2 bits from a memory cell selected by a column selection address. The read information is then latched in the latches coupled to the associated merged I/O block 112. The latched data is coupled to data transmission lines by a combination of signals YAi (i=0 to 15) and YBi (i=0 to 15) pre-decoded in accordance with column selection addresses.

In each merged I/O block, first side nodes of NMOS transistors subjected to the YAi decoding are connected to the associated latches. The NMOS transistors are coupled in common at the second side nodes thereof so that odd ones are coupled together while even ones are coupled together. The common nodes of the NMOS transistors subjected to the YAi decoding are coupled to respective first side nodes of two NMOS transistors which are subjected to the same YBi decoding. The NMOS transistors subjected to the YBi decoding are coupled at the second side nodes thereof to two different data transmission lines, respectively. By the above-mentioned arrangement, the column selecting circuit of FIG.

11 provides paths respectively connecting adjacent data latches to different data lines using a one row selection address.

As apparent from the above description, the memory device of the present invention has a structure capable of increasing the storage capacity of memory cells while simplifying the whole circuit arrangement. The memory device of the present invention also has an advantage in that it has a NAND-type organization to which a current sensing technique is applicable. Advantageously, the present invention also provides an improved column selecting circuit which can be appropriately used for the above-mentioned memory device. In addition, the multi-state memory device of the present invention, which is adapted to store multi-bit data per memory cell, has an effect of achieving improved erasing, programming, erasure/program verifying, and reading operations.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A non-volatile integrated circuit memory device comprising:

an array of memory cells arranged in rows and columns;

a plurality of word lines wherein each of said word lines corresponds to a respective row of said memory cells;

a plurality of bit lines arranged orthogonally with respect to said word lines wherein each of said bit lines corresponds to a respective column of said memory cells;

a current supplying transistor including a source coupled to a supply voltage source, a gate coupled to a static voltage source, and a drain coupled to said bit lines, wherein said current supplying transistor provides a static current to said bit lines during data read operations;

a storage unit having a pair of latches coupled to respective input/output lines to perform a data exchange, wherein said latches are further coupled to respective bit lines to perform a sense operation during said data read operation;

a pair of storage control transistors, wherein each of said storage control transistors is associated with a respective one of said latches and wherein each of said storage control transistors inverts and maintains a state of data latched in said storage unit in accordance with levels of said bit lines in response to enable signals applied thereto during a reading operation;

an initialization transistor connected to each of said bit lines, wherein said initialization transistor initializes said storage unit in response to a control signal applied thereto before execution of said reading operation while maintaining said bit lines at respective predetermined voltage levels; and a pair of program data transmission transistors each arranged between a respective one of said latches of said storage unit and respective bit lines associated with said respective latch, wherein each of said program data transmission transistors transmits data latched in said respective latch to said associated bit lines during a programming operation.

2. A non-volatile integrated circuit memory device according to claim 1 wherein said memory cells are chosen from the group consisting of mask ROM memory cells, EEPROM memory cells, and flash-EEPROM memory cells.

3. A non-volatile integrated circuit memory device according to claim 1 wherein said memory cell array has a memory connection chosen from the group consisting of a NAND-type connection and a NOR-type connection.

4. A non-volatile integrated circuit memory device according to claim 1 wherein said bit lines which are not selected during said reading operation are biased to a ground voltage level.

5. A non-volatile integrated circuit memory device according to claim 4 wherein said unselected bit lines are biased to said ground voltage level responsive to a bit line selection signal.

6. A non-volatile integrated circuit memory device according to claim 1 wherein one of said latches controls a data inverting path for another of said latches during said reading operation so that said multi-bit data is read.

7. A non-volatile integrated circuit memory device according to claim 1 wherein multi-bit data is sensed during said reading operation based on a difference between said static current supplied to said selected bit line and a cell current generated from a selected memory cell based on a voltage applied to said word line associated with said selected memory cell.

8. A non-volatile integrated circuit memory device according to claim 1 wherein a voltage which has a step-shaped wave form falling from higher values to lower values over time is applied to said selected word line during said reading operation.

9. A non-volatile integrated circuit memory device according to claim 8 wherein said step shaped voltage has a level corresponding to a value defined between adjacent threshold voltages distributed in said memory cells.

10. A non-volatile integrated circuit memory device according to claim 1 wherein said unselected bit lines are biased to a supply voltage during a programming operation thereby inhibiting programming of said memory cells associated with said unselected bit lines.

11. A non-volatile integrated circuit memory device according to claim 10 wherein said biasing of said unselected bit lines is performed responsive to a bit selection signal.

12. A non-volatile integrated circuit memory device according to claim 1 wherein said programming operation includes repetitively executing sequential program loops associated with said latches.

13. A non-volatile integrated circuit memory device according to claim 1 wherein said programming verifying includes controlling a data inverting path associated with one of said latches based on data latched in another of said latches.

14. A non-volatile integrated circuit memory device according to claim 1 wherein a level of a selected word line associated with a selected memory cell during a program verifying operation is higher than a level of said selected word line by a predetermined voltage during a reading operation so that a threshold voltage of said memory cell used in said programming operation is higher than a word line level used during a reading operation, thereby ensuring a margin in said reading operation.

15. A non-volatile integrated circuit memory device according to claim 1 wherein unselected bit lines are electrically biased during reading and programming operations, and wherein said unselected bit lines are floating during erasing operations.

16. A non-volatile integrated circuit memory device according to claim 1 wherein data stored in memory cells associated with a selected one of said blocks are erased at one time.

17. A non-volatile integrated circuit memory device according to claim 1 wherein erasure verifying data for two adjacent data bit lines are latched in said latches respectively associated with said two adjacent data bit lines in two cycles of an erasure verifying operation for said adjacent bit lines.

18. A non-volatile integrated circuit memory device comprising:

a plurality of parallel bit lines on a substrate;

a plurality of word lines on said substrate wherein said word lines are orthogonal to said bit lines;

a plurality of memory cell strings on said substrate with each of said memory cell strings being connected at one end thereof to a respective one of said bit lines, wherein each of said memory cell strings includes a plurality of series-connected memory cells, wherein each of said memory cells includes a control gate coupled to a respective word line, a floating gate, and spaced apart source and drain regions, and wherein each of said memory cells can store multi-state data;

a row decoder connected to each of said word lines wherein said row decoder drives a selected one of said word lines to a first threshold level during a first time interval of a read operation, wherein said row decoder drives said selected word line to a second threshold level during a second time interval of said read operation, wherein said row decoder drives said selected word line to a third threshold level during a third time interval of said read operation, and wherein said row decoder drives non-selected ones of said word lines to a word line pass level;

a bit line selection circuit that connects a selected one of said bit lines to a current supply line during said read operation wherein said bit line selection circuit drives non-selected ones of said bit lines to a bit line pass level;

a current supply which provides a current to said current supply line during said read operation;

a first latch coupled to said current supply line through a first initialization circuit wherein said first initialization circuit initializes said first latch prior to said read operation;

a second latch coupled to said current supply line through a second initialization circuit wherein said second initialization circuit initializes said second latch prior to said read operation;

a first inverting circuit coupled to said first latch wherein said first inverting circuit inverts an output of said first latch responsive to a high voltage of said current supply line, a non-inverted state of said second latch and a first enable signal during one of said read operation time intervals; and a second inverting circuit coupled to said second latch wherein said second inverting circuit inverts an output of said second latch responsive to a high voltage of said current supply line, and a second enable signal during one of said read operation time intervals.

19. A non-volatile integrated circuit memory device according to claim 18 wherein said first threshold level is a first voltage, said second threshold level is a second voltage, and said third threshold level is a third voltage, and wherein said first, second, and third voltages are all different.

20. A non-volatile integrated circuit memory device according to claim 19 wherein said first voltage is higher than said second voltage, and wherein said second voltage is higher than said third voltage.

* * * * *